(12) United States Patent
Ji et al.

(10) Patent No.: US 9,230,963 B2
(45) Date of Patent: Jan. 5, 2016

(54) SEMICONDUCTOR DEVICE WITH DUAL WORK FUNCTION GATE STACKS AND METHOD FOR FABRICATING THE SAME

(71) Applicant: SK hynix Inc., Gyeonggi-do (KR)

(72) Inventors: Yun-Hyuck Ji, Gyeonggi-do (KR);
Se-Aug Jang, Gyeonggi-do (KR);
Seung-Mi Lee, Gyeonggi-do (KR);
Hyung-Chul Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/606,776

(22) Filed: Jan. 27, 2015

(65) Prior Publication Data

US 2015/0137257 A1 May 21, 2015

Related U.S. Application Data

(63) Continuation of application No. 13/845,174, filed on Mar. 18, 2013, now Pat. No. 8,962,463.

(30) Foreign Application Priority Data

Dec. 27, 2012 (KR) .......................... 10-2012-0154941

(51) Int. Cl.
| | |
|---|---|
| *H01L 21/70* | (2006.01) |
| *H01L 27/092* | (2006.01) |
| *H01L 29/40* | (2006.01) |
| *H01L 21/28* | (2006.01) |
| *H01L 29/49* | (2006.01) |
| *H01L 29/51* | (2006.01) |
| *H01L 29/78* | (2006.01) |
| *H01L 21/8238* | (2006.01) |

(52) U.S. Cl.
CPC ...... *H01L 27/0922* (2013.01); *H01L 21/28088* (2013.01); *H01L 21/823842* (2013.01); *H01L 29/401* (2013.01); *H01L 29/4966* (2013.01); *H01L 29/517* (2013.01); *H01L 29/78* (2013.01)

(58) Field of Classification Search
CPC ............... H01L 21/823857; H01L 21/823842; H01L 21/28088; H01L 29/517; H01L 51/5206
USPC ..................... 257/369, 407, E21.19, E21.632
See application file for complete search history.

(56) References Cited

U.S. PATENT DOCUMENTS

| | | | | |
|---|---|---|---|---|
| 2010/0044800 | A1* | 2/2010 | Tseng et al. ................... | 257/371 |
| 2011/0062524 | A1* | 3/2011 | Lin et al. ........................ | 257/369 |
| 2012/0045892 | A1* | 2/2012 | Sengoku ........................ | 438/592 |
| 2012/0049288 | A1* | 3/2012 | Maruyama et al. ........... | 257/369 |

FOREIGN PATENT DOCUMENTS

| | | | |
|---|---|---|---|
| EP | 2112687 A2 | * | 10/2009 |
| JP | 2009290200 A | * | 12/2009 |

* cited by examiner

*Primary Examiner* — Brook Kebede
(74) *Attorney, Agent, or Firm* — IP & T Group LLP

(57) ABSTRACT

A method for fabricating a semiconductor device includes forming a gate dielectric layer over a substrate; forming a metal containing layer, containing an effective work function adjust species, over the gate dielectric layer; forming an anti-reaction layer over the metal containing layer; increasing an amount of the effective work function adjust species contained in the metal containing layer; and forming, on the substrate, a gate stack by etching the anti-reaction layer, the metal containing layer, and the gate dielectric layer.

9 Claims, 10 Drawing Sheets

SEMICONDUCTOR DEVICE WITH DUAL WORK FUNCTION GATE STACKS AND METHOD FOR FABRICATING THE SAME

CROSS-REFERENCE TO RELATED APPLICATIONS

This application is a continuation of U.S. patent application Ser. No. 13/845,174 filed on Mar. 18, 2013, which claims priority of Korean Patent Application No. 10-2012-0154941, filed on Dec. 27, 2012. The disclosure of each of the foregoing application is incorporated herein by reference in its entirety.

BACKGROUND

1. Field

Exemplary embodiments of the present invention relate to a semiconductor device, and more particularly, to a semiconductor device with dual work function gate stacks and a method for fabricating the same.

2. Description of the Related Art

When a transistor is scaled down to improve performance, gate leakage increases while the thickness of a gate dielectric layer is reduced. In order to solve such a problem, the gate dielectric layer has been replaced with a high-k material having a larger dielectric constant than that of $SiO_2$. The high-k material may include metal oxide containing hafnium, zirconium or the like. As the high-k material is adopted, a new problem, that is, a Fermi level pinning effect has occurred. The Fermi level pinning effect is caused by the contact between the high-k material and a polysilicon gate electrode. The Fermi level pinning is a basic characteristic at the boundary between the polysilicon gate electrode and the metal oxide, and increases the threshold voltage of a transistor.

In the transistor, the gate electrode requires a threshold voltage (Vth) for conducting a channel. According to processes of a CMOS device, both of an N-channel transistor and a P-channel transistor may be fabricated. The threshold voltage is influenced by an effective work function. In general, a gate stack includes a gate dielectric layer and a gate electrode, and the gate dielectric layer and the gate electrode determine an effective work function of the gate stack. Furthermore, a gate process may have an effect on the effective work function of the gate stack. The effective work function is distinguished from a work function. The effective work function of the gate stack is a parameter which may be adjusted by the material of the gate dielectric layer, the material of the gate electrode, and the gate stack formation process. On the other hand, the work function of the gate electrode is a specific property of a material. In general, the work function of a specific material (that is, metal layer) corresponds to the value of energy required for discharging electrons within the material into vacuum from atoms of the material, when the electrons are positioned at the Fermi level at the initial stage. The work function has a unit of eV. In general, a gate electrode of an N-channel transistor has an N-type work function lower than a midgap work function, and a gate electrode of a P-channel transistor has a P-type work function higher than the midgap work function.

Recently, in order to solve the Fermi level pinning issue, a gate stack including a high-k material and a metal gate electrode has been adopted. However, during a process for fabricating a CMOS device, it is difficult to form a metal gate electrode having an N-type work function or a P-type work function which requires a threshold voltage suitable for each transistor. Furthermore, although the metal gate electrode having a work function suitable for each transistor is formed, the effective work function of the gate stack may be varied due to various factors caused by the material of the gate dielectric layer contacted with the metal gate electrode and the gate stack formation process (for example, etch process and high-temperature thermal process). Furthermore, the CMOS device may be fabricated by using dual work function metal gate electrodes. In this case, one of the dual work function metal gate electrodes needs to be selectively removed. Accordingly, substantial complexity increases, and the fabrication cost increases.

SUMMARY

An exemplary semiconductor device and a method for fabricating the same. The exemplary semiconductor device includes dual work function gate stacks that are capable of independently controlling the threshold voltages of an N-channel transistor and a P-channel transistor.

An exemplary semiconductor device and a method for fabricating the same. The exemplary semiconductor device includes dual work function gate stacks that are capable of preventing an effective work function of a gate stack from being varied during a subsequent process.

A method for fabricating a semiconductor device includes forming a gate dielectric layer over a substrate; forming a metal containing layer, containing an effective work function adjust species, over the gate dielectric layer; forming an anti-reaction layer over the metal containing layer; increasing an amount of the effective work function adjust species contained in the metal containing layer; and forming, on the substrate, a gate stack by etching the anti-reaction layer, the metal containing layer, and the gate dielectric layer.

A method for fabricating a semiconductor device includes forming a gate dielectric layer on an entire surface of a substrate including a first region and a second region; forming a nitrogen-rich first metal nitride layer over the gate dielectric layer; forming an anti-reaction layer over the first metal nitride layer; implanting an effective work function increase species into the nitrogen-rich first metal nitride layer; removing the anti-reaction layer and the nitrogen-rich first metal nitride layer from the second region; forming a metal-rich second metal nitride layer on an entire surface of a resultant structure, including the gate dielectric layer formed in the second region; forming a first gate stack in the first region by etching the metal-rich second metal nitride layer, the anti-reaction layer, the nitrogen-rich first metal nitride layer, and the gate dielectric layer; and forming a second gate stack in the second region by etching the second metal nitride and the gate dielectric layer.

A method for fabricating a semiconductor device, the method includes forming a gate dielectric layer on an entire surface of a substrate comprising a first region and a second region; forming a first metal containing layer containing a first effective work function adjust species forming an anti-reaction layer over the gate dielectric layer; increasing an amount of the first effective work function adjust species contained in the first metal containing layer; removing the anti-reaction layer and the first metal containing layer from the second region; forming a second metal containing layer, containing a second effective work function adjust species, on an entire surface of a resultant structure, including the gate dielectric layer formed in the second region; forming a first gate stack in the first region by etching the second metal containing layer, the anti-reaction layer, the first metal containing layer, and the gate dielectric layer; and forming a second gate stack in the second region by etching the second metal containing layer and the gate dielectric layer.

A semiconductor device includes a substrate comprising a first region and a second region; a first gate stack formed over the first region, the first gate stack comprising a first metal containing gate electrode containing a first effective work function adjust species, and an anti-reaction layer formed over the first metal containing gate electrode; and a second gate stack formed over the second region, the second gate stack comprising a second metal containing gate electrode containing a second effective work function adjust species.

The first gate stack further may comprise a metal containing layer formed over the anti-reaction layer, the metal containing layer comprising the same material as a material of the second metal containing gate electrode. The anti-reaction layer may comprise polysilicon.

The first effective work function adjust species may comprise nitrogen. The second effective work function adjust species may comprise titanium. The first metal containing gate electrode may comprise titanium nitride TiN) including nitrogen at a higher ratio than a chemical stoichiometric ratio of titanium to nitrogen. The second metal containing gate electrode may comprise titanium nitride (TiN) including titanium at a higher ratio than a chemical stoichiometric ratio of titanium to nitrogen.

The first gate stack may comprise a gate stack of a P-channel transistor. The second gate stack may comprise a gate stack of an N-channel transistor. The first gate stack may further comprise a first interface layer and a first high-k material formed under the first metal containing gate electrode, and the second gate stack may further comprise a second interface layer and a second high-k material formed under the second metal containing gate electrode.

DETAILED DESCRIPTION

Figure 1:
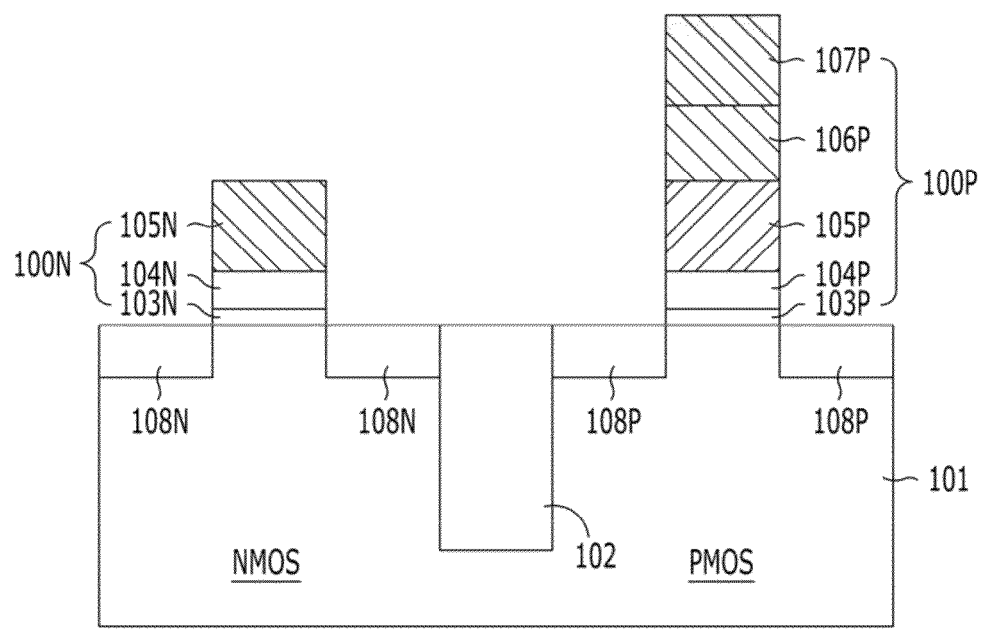
FIG. 1 is a diagram illustrating an exemplary semiconductor device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a diagram illustrating an exemplary semiconductor device.

Referring to FIG. 1, a substrate 101 includes first and second regions. The substrate 101 may include a silicon substrate, a silicon germanium substrate, or a silicon-on-insulator (SOI) substrate. The first and second regions are isolated by an isolation region 102. The first and second regions may include a transistor region. For example, the first region may be where a P-channel transistor is formed (PMOS), and the second region may be where an N-channel transistor is formed (NMOS). A first gate stack 100P is formed over the substrate 101 of the first region PMOS, and a second gate stack 100N is formed over the substrate 101 of the second region NMOS. A first source 108P and a first drain 108P are formed in the substrate 101 at both sides of the first gate stack 100P. A second source 108N and a second drain 108N are formed in the substrate 101 at both sides of the second stack 100N.

The first gate stack 100P may include a first gate dielectric layer 104P, a first metal containing gate electrode 105P, an anti-reaction layer 106P, and a metal containing layer 107P, which are sequentially stacked. The first gate stack 100P may further include a first interface layer 103P formed between the first gate dielectric layer 104P and the substrate 101. The first gate stack 100P may include a first effective work function adjust species. The first effective work function adjust species may be contained in the first metal containing gate electrode 105P. Due to the first effective work function adjust species, the first gate stack 100P has an effective work function suitable for the P-channel transistor.

The second gate stack 100N may include a second gate dielectric layer 104N and a second metal containing gate electrode 105N which are sequentially stacked. The second gate stack 100N may further include a second interface layer 103N formed between the second gate dielectric layer 104N and the substrate 101. The second gate stack 100N may include a second effective work function adjust species. The second effective work function adjust species may be contained in the second metal containing gate electrode 105N. Due to the second effective work function adjust species, the second gate stack 100N has an effective work function suitable for the N-channel transistor.

Thus, the first region PMOS includes the first gate stack 100P that includes a first work function structure having a first effective work function, and the second region NMOS includes the second gate stack 100N that includes a second work function structure having a second effective work function that is different than the first effective work function.

The structure of the semiconductor device will be described in more detail as follows.

First, the first interface layer 103P and the second interface layer 103N may be formed of the same material, and may have the same thickness. The first interface layer 103P or second interface layer 103N may include silicon oxide or silicon oxynitride. For example, the first interface layer 103P or second interface layer 103N may include $SiO_2$ or SiON. The first interface layers 103N and the second interface layers 103N serve to improve the interface characteristic between the substrate 101 and the first gate dielectric layer 104P and the second gate dielectric layer 104N, thereby enhancing an electron mobility characteristic.

The first gate dielectric layer 104P and the second gate dielectric layer 104N may be formed of the same material, and may have the same thickness. The first gate dielectric layer 104P and second gate dielectric layer 104N may include a high-k material having a high dielectric constant. The high-k material has a larger dielectric constant than the dielectric constant (about 3.9) of $SiO_2$. Furthermore, the high-k material has a considerably larger physical thickness and a smaller equivalent oxide thickness (EOT) than $SiO_2$. The first gate dielectric layer 104P and the second gate dielectric layer 104N may have a larger dielectric constant than the first and second interface layers 103P and 103N. The first gate dielectric layer 104P and the second gate dielectric layer 104N may include, for example, a metal oxide, a metal silicate, or a metal silicate nitride. The metal oxide may contain, for example, hafnium (Hf), aluminum (Al), lanthanum (La), or zirconium (Zr). The metal oxide may include hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate may contain, for example, Hf or Zr. For example, the metal silicate may include hafnium silicate (HfSiO), zirconium silicate (ZrSiO), or a combination thereof. The metal silicate nitride may include hafnium silicate nitride (HfSiON), zirconium silicate nitride (ZrSiON), or a combination thereof.

The first metal containing gate electrode 105P may contain the first effective work function adjust species. Due to the first effective work function adjust species, the first gate stack 100P has an effective work function suitable for the P-channel transistor. The first metal containing gate electrode 105P may include a P-type work function metal containing layer. Therefore, the first metal containing gate electrode 105P may become a P-type work function metal containing gate electrode. The P-type work function metal containing gate electrode may include a material having a work function of about 4.7 eV or more (about 4.7 eV to about 5.1 eV). The P-type work function metal has a similar value to the work function of P-type polysilicon. The P-type work function metal containing gate electrode has a larger effective work function than a midgap work function of silicon. The first effective work function adjust species may include an effective work function increase species to increase the effective work function. As the effective work function increase species is contained, the effective work function of the first gate stack 100P increases. As such, the first metal containing gate electrode 105P containing the effective work function increase species may be referred to as a high effective work function material.

The effective work function increase species may include nitrogen. The first metal containing gate electrode 105P may include nitrogen as the first effective work function adjust species. The first metal containing gate electrode 105P may include a metal nitride containing the first effective work function adjust species. The first metal containing gate electrode 105P may include nitrogen rich metal nitride. Here, the nitrogen becomes the first effective work function adjust species. The metal nitride may include titanium nitride. When the first effective work function adjust species includes nitrogen, the first metal containing gate electrode 105P may include nitrogen rich titanium nitride. Nitrogen rich titanium nitride refers to titanium nitride containing nitrogen at a higher ratio than a chemical stoichiometric ratio of titanium to nitrogen. Hereafter, the nitrogen rich titanium nitride is referred to as nitrogen rich TiN (N-rich TiN). TiN has a different effective work function depending on a composition ratio of titanium to nitrogen. For example, N-rich TiN may have a P-type effective work function suitable for the P-channel transistor. The N-rich TiN may be formed by physical vapor deposition (PVD). Accordingly, the composition ratio of titanium to nitrogen within TiN may be easily adjusted. N-rich TiN is formed as the first metal containing gate electrode 105P. When the N-rich TiN is formed, a flow rate of nitrogen may be selectively controlled to adjust the composition ratio of nitrogen to titanium. As such, the flow rate of nitrogen may be controlled to form N-rich TiN having a P-type work function. The N-rich TiN may be formed by atomic layer deposition (ALD).

The second metal containing gate electrode 105N may contain a second effective work function adjust species. Due to the second effective work function adjust species, the second gate stack 100N has an effective work function suitable for the N-channel transistor. The second metal containing gate electrode 105N may include an N-type work function metal containing layer. Therefore, the second metal containing gate electrode 105N may become an N-type work function metal containing gate electrode. The N-type work function metal containing gate electrode may include a material having a work function of about 4.3 eV or less. The N-type work function has a similar value to the work function of N-type polysilicon. The N-type work function metal containing gate electrode has a smaller work function than the midgap work function of silicon. The second effective work function adjust species may include an effective work function decrease species to decrease the effective work function. As the effective work function decrease species is contained, the effective work function of the second gate stack 100N decreases. As such, the second metal containing gate electrode 105N containing the effective work function decrease species may be referred to as a low effective work function material.

The effective work function decrease species may include a metal. The second metal containing gate electrode 105N may include a metal as the second effective work function adjust species. The second metal containing gate electrode 105N may include a metal nitride containing the second effective work function adjust species. The second metal containing gate electrode 105N may include a metal rich metal nitride. Here, the metal becomes the second effective work function adjust species.

The metal nitride serving as the second metal containing gate electrode 105N may include TiN. When the second effective work function adjust species contains titanium, the second metal containing gate electrode 105N may include titanium rich TiN. The Ti-rich TiN refers to TiN containing titanium at a higher ratio than a chemical stoichiometric ratio of titanium to nitrogen. TiN has a different work function depending on the comparison ratio of titanium to nitrogen. For example, Ti-rich TiN may have an N-type effective work function suitable for the N-channel transistor. The Ti-rich TiN may be formed by PVD. Accordingly, the composition ratio of titanium to nitrogen within TiN may be easily adjusted. Ti-rich TiN is formed as the second metal containing gate electrode 105N. When the Ti-rich TiN is formed, a flow rate of nitrogen may be selectively controlled to adjust the composition ratio of titanium to nitrogen. As such, the flow rate of nitrogen may be controlled to form Ti-rich TiN having an N-type effective work function. The Ti-rich TiN may be formed by ALD.

The anti-reaction layer 106P and the metal containing layer 107P formed over the first metal containing gate electrode 105P may serve as an anti-oxidation layer to block oxygen from being introduced into the first metal containing gate electrode 105P and the first gate dielectric layer 104P during a subsequent process. The anti-reaction layer 106P may serve to prevent inter-mixing between the first metal containing gate electrode 105P and the metal containing layer 107P. The anti-reaction layer 106P contains a silicon containing layer. The anti-reaction layer 106P may include polysilicon.

The metal containing layer 107P may be formed of the same material as the second metal containing gate electrode 105N. Therefore, the metal containing layer 107P may include a metal rich metal nitride. That is, the metal containing layer 107P may include Ti-rich TiN. Although the metal containing layer 107P includes a high effective work function material, the work function of the first metal containing gate electrode 105P is not reduced because of the anti-reaction layer 106P. The effective work function of the first gate stack 100P is dominantly adjusted by the first metal containing gate electrode 105P. Although described below, the metal containing layer 107P may be formed at the same time when the second metal containing gate electrode 105N is formed, and is not removed during a subsequent process.

The first metal containing gate electrode 105P and the anti-reaction layer 106P may be annealed. The annealing may be performed in an atmosphere containing the first effective work function adjust species. The annealing may be performed at a nitrogen containing atmosphere. Nitrogen is an effective work function increase species. For example, the annealing may be performed in an atmosphere of $NH_3$ at a temperature of about 700° C. for about one hour. As the annealing is performed in an atmosphere containing an effective work function increase species, the effective work function increase species may be injected into the first metal containing gate electrode 105P. Accordingly, the content of the effective work function increase species contained in the first metal containing gate electrode 105P may be further increased. As a result, the effective work function of the first gate stack 100P is further increased. Furthermore, the anti-reaction layer 106P is crystallized by the annealing. As the crystallized anti-reaction layer 106P is formed, an oxygen introduction prevention effect and a reaction prevention effect are further improved.

The first source 108P and the first drain 108P may include a P-type source and drain, and the second source 108N and the second drain 108N may include an N-type source and drain.

Referring to FIG. 1, since the first gate stack 100P includes the first metal containing gate electrode 105P containing the first effective work function adjust species to increase the effective work function, the first gate stack 100P may secure a high effective work function suitable for the P-channel transistor. Accordingly, the threshold voltage may be shifted in a positive direction. Furthermore, as the effective work function adjust species is injected into the first metal containing gate electrode 105P through the annealing, the effective work function of the first gate stack 100P may be further increased. Furthermore, as the anti-reaction layer 106P is formed over the first metal containing gate electrode 105P, the work function of the first metal containing gate electrode 105P may be prevented from being decreased during a subsequent process.

Furthermore, since the second gate stack 100N includes the second metal containing gate electrode 105N containing the second effective work function adjust species to decrease the effective work function, the second gate stack 100N may secure a low effective work function suitable for the N-channel transistor. Accordingly, the threshold voltage may be shifted in a negative direction.

Referring to FIG. 1, the threshold voltages of the N-channel transistor and the P-channel transistor may be independently controlled during an integration process of a CMOS device.

The exemplary semiconductor device of FIG. 1 may include a CMOS device. However, the exemplary semiconductor device is not limited to the CMOS device. The exemplary semiconductor device may include any semiconductor device in which an N-channel transistor and a P-channel transistor are formed. The P-channel transistor may include, for example, a PMOSFET or a PMISFET. The N-channel transistor may include, for example, a NMOSFET or a NMISFET. The first gate stack 100P and the second gate stack 100N have a high-k metal gate (HKMG) structure including a high-k material and a metal containing gate electrode.

FIGS. 2A to 2H are diagrams illustrating an exemplary method of fabricating a semiconductor device. Hereafter, a method of fabricating an exemplary CMOS device will be described. However, the exemplary method is not limited to a method of fabricating a CMOS device, but may be applied to any semiconductor device in which an N-channel transistor and a P-channel transistor are formed. Furthermore, the exemplary method may be applied to a method for fabricating an N-channel transistor and a method for fabricating a P-channel transistor, respectively. The P-channel transistor may include a PMOSFET, and the N-channel transistor may include a NMOSFET.

Figure 2A:
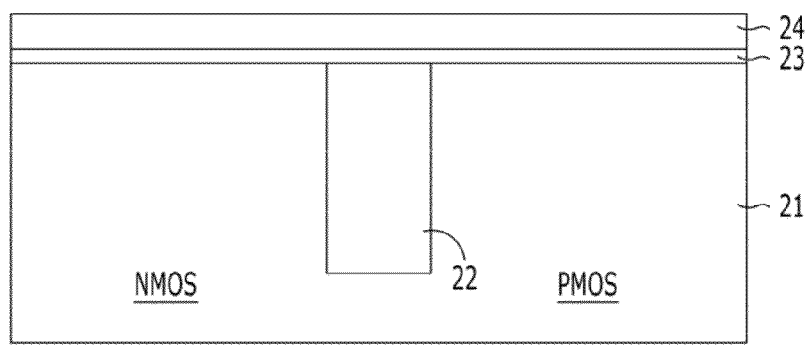
FIGS. 2A to 2H are diagrams illustrating an exemplary method for fabricating a semiconductor device.

Referring to FIG. 2A, a substrate 21 is prepared. The substrate 21 may include a plurality of regions in which a transistor is formed. The plurality of regions may include a first region PMOS and a second region NMOS. The substrate 21 may include a semiconductor material. The substrate 21 may include a semiconductor substrate. The substrate 21 may include a silicon substrate, a silicon germanium substrate, or a silicon-on-insulator (SOI) substrate.

An isolation region 22 is formed in the substrate 21. The isolation region 22 may be formed through a shallow trench isolation (STI) process. For example, a pad layer is formed over the substrate 21, and an isolation mask (not illustrated) is used to etch the pad layer and the substrate 21. Accordingly, a trench is formed. After the trench is formed, the trench is filled with an insulator to form the isolation region 22. The isolation region 22 may include a wall oxide, a liner, and a fill dielectric, which are sequentially formed therein. The liner may be formed by stacking silicon nitride and silicon oxide. The silicon nitride may include $Si_3N_4$, and the silicon oxide may include $SiO_2$. The fill dielectric may include a spin-on dielectric (SOD). Alternatively, the isolation region 22 may include a silicon nitride as the fill dielectric.

Although not illustrated, a typical well formation process and a typical channel formation process may be performed. A P-type well is formed in the second region NMOS, and an N-type well is formed in the first region PMOS. In order to form the P-type well, a P-type dopant, such as boron (B) or $BF_2$ may be implanted. Furthermore, in order to form the N-type well, an N-type dopant, such as phosphorus (P) or arsenic (As) may be implanted. After the well formation process, an N-channel and a P-channel may be formed through a typical channel formation process. The N-channel may be formed in the second region NMOS, and the P-channel may be formed in the first region PMOS. In order to form the P-channel, an N-type dopant, such as phosphorus or arsenic may be implanted. In order to form the N-channel, a P-type dopant, such as boron may be implanted. The threshold voltage is set by implanting the N-type dopant into the channel region of the P-channel transistor, but there is a limitation in reducing the threshold voltage.

In an exemplary embodiment, as germanium is contained in the P-channel region, an energy band gap may be controlled to further reduce the threshold voltage. In order to contain germanium into the P-channel region, germanium ions may be implanted into the substrate. Furthermore, silicon germanium may be formed through epitaxial growth.

An interface layer 23 is formed over the substrate 21. A high-k material 24 is formed over the interface layer 23. Before the interface layer 23 is formed, a cleaning process may be performed. The cleaning process uses a solution including hydrofluoric acid (HF). As the cleaning process is performed, native oxide on the surface of the substrate 21 may be removed. Simultaneously, any dangling bonds on the surface of the substrate 21 may be passivated by hydrogen to suppress growth of native oxide until a subsequent process is performed.

The interface layer 23 may include silicon oxide or silicon oxynitride. For example, the interface layer 23 may include $SiO_2$ or SiON. The interface layer 23 serves to improve an interface characteristic between the substrate 21 and the high-k material 24, thereby enhancing an electron mobility characteristic. If the interface layer 23 is made of silicon oxide, the silicon oxide may be formed by a thermal oxidation method or grown by a wet method using ozone. In particular, if the silicon oxide to be used as the interface layer 23 is grown by a wet method using ozone and the high-k material 24 is a hafnium containing silicate material, then Hf rich hafnium silicate (HfSiO) may be formed during the formation of the high-k material 24. Accordingly, the dielectric constant of the high-k material 24 is increased. The interface layer 23 is formed to a thickness of about 5 Å to about 13 Å. The high-k material 24 may include high-k materials having a high dielectric constant.

The high-k material 24 may be formed of the same material in the first region PMOS and the second region NMOS. The high-k material 24 has a larger dielectric constant than the dielectric constant (about 3.9) of $SiO_2$ used as a general gate dielectric layer. Furthermore, the high-k material 24 has a considerably larger physical thickness and a lower EOT than $SiO_2$. The high-k material 24 may have a larger dielectric constant than the interface layer 23.

The high-k material 24 may include, for example, a metal oxide, a metal silicate, or a metal silicate nitride. The metal oxide may include, for example, Hf, Al, La, or Zr. The metal oxide may include, for example, hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate may include, for example, Hf or Zr. For example, the metal silicate may include HfSiO, ZrSiO, or a combination thereof. For example, the metal silicate nitride may include hafnium silicate nitride (HfSiON), zirconium silicate nitride (ZrSiON), or a combination thereof.

As the high-k material 24 is formed in the first and second regions PMOS and NMOS at the same time, the process is simplified. Meanwhile, different materials may be used as the high-k material 24 in the first region PMOS and second region NMOS. The formation process of the high-k material 24 may include a suitable deposition technique. For example, the formation process may include chemical vapor deposition (CVD), low-pressure CVD (LPCVD), plasma-enhanced CVD (PECVD), metal-organic CVD (MOCVD), atomic layer deposition (ALD), or plasma-enhanced ALD (PEALD). In order to form a uniform layer, ALD or PEALD may be applied. The high-k material 24 may be formed to a thickness of about 15 Å to about 60 Å.

In an exemplary embodiment, a metal silicate nitride may be used as the high-k material 24. In order to form the metal silicate nitride as the high-k material 24, a metal silicate may be first formed, and then, a nitridation process and an annealing process may be sequentially performed. The nitrification process may include plasma nitridation. Accordingly, nitrogen is injected into the high-k material 24. For example, when the high-k material 24 is HfSiON, HfSiO may be first formed, and HfSiON may be then formed by the nitridation process. As such, when nitrogen is injected into the metal silicate, the dielectric constant may be increased, and the crystallization of the metal silicate may be suppressed during a subsequent thermal process. The plasma nitridation process may be performed at a temperature of about 400° C. to about 600° C. Furthermore, during the plasma nitridation, a gas mixture of argon (Ar) and nitrogen ($N_2$) may be used as reaction gas. As the metal silicate is exposed to nitrogen plasma during the plasma nitridation, the metal silicate becomes metal silicate nitride. As a nitrogen source for nitrogen plasma, another gas may be used in addition to $N_2$. For example, the nitrogen source may include ammonia ($NH_3$) or hydrazine ($N_2H_4$). After the nitridation process, the annealing process is performed. Since the annealing process is performed after the nitridation process, the annealing process is referred to as a post nitridation annealing. Through the plasma nitridation, the surface of the metal silicate has a nitrogen-rich state. When the annealing process is performed, nitrogen atoms injected into the metal silicate may be uniformly diffused inside the metal silicate. The annealing process may be performed under a nitrogen gas ($N_2$) atmosphere at a temperature of about 500° C. to 900° C.

Through the above-described series of the metal silicate formation process, the nitridation process, and the annealing process, the metal silicate nitride may be formed as the high-k material 24. When the metal silicate nitride is used to form the high-k material 24, the dielectric constant may be increased. Furthermore, crystallization may be suppressed during a subsequent thermal process. The high-k material 24 may become a gate dielectric layer.

Figure 2B:
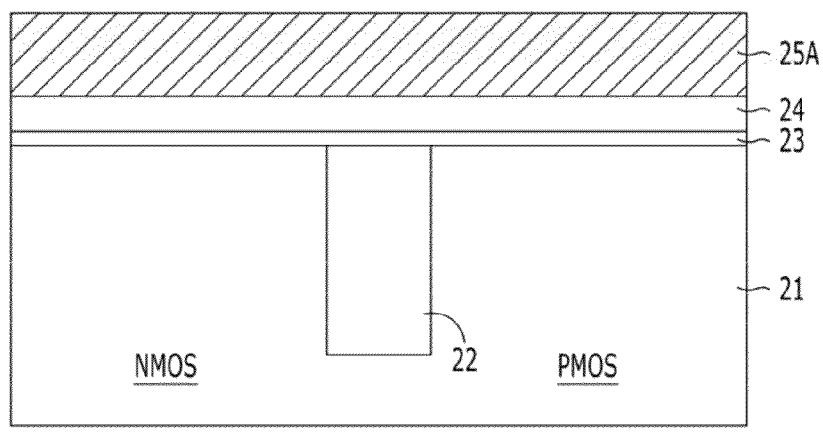

Referring to FIG. 2B, a first metal containing layer 25A is formed over the high-k material 24. The first metal containing layer 25A may be formed on the entire surface of the substrate 21 including the high-k material 24. The first metal containing layer 25A may contain the first effective work function adjust species. Due to the first effective work function adjust species, the first metal containing layer 25A has a work function suitable for the P-channel transistor. Therefore, the first metal containing layer 25A may become a P-type work function metal containing layer. The P-type work function metal containing layer may include materials having an effective work function of about 4.7 eV to about 5.2 eV.

The first effective work function adjust species contained in the first metal containing layer 25A may include an effective work function increase species to increase the effective work function. The first metal containing layer 25A has a first work function. As the first metal containing layer 25A contains the effective work function increase species, the first work function may be changed to a second work function larger than the first work function. For example, the first work function may include a midgap work function. The second work function has a value of about 4.7 eV or more. Therefore, the first metal containing layer 25A becomes a high effective work function material. The effective work function increase species may include nitrogen.

The first metal containing layer 25A may include nitrogen rich metal nitride. The metal nitride may include TiN. The first metal containing layer 25A may include TiN containing an effective work function increase species. The first metal containing layer 25A may include nitrogen as the effective work increase species. Therefore, the first metal containing layer 25A may include N-rich TiN. The N-rich TiN refers to TiN containing nitrogen at a higher ratio than the chemical stoichiometric ratio of titanium to nitrogen. TiN has a different work function depending on the composition ratio of titanium to nitrogen. For example, N-rich TiN containing nitrogen at a higher ratio has an effective work function suitable for a P-channel transistor. On the other hand, Ti-rich TiN containing titanium at a higher ratio has an effective work function suitable for an N-channel transistor. Accordingly, the Ti-rich TiN may have a low effective work function. The N-rich TiN may be formed by PVD. Accordingly, the composition ratio of titanium to nitrogen within TiN may be easily controlled. Since the first metal containing layer 25A has a high effective work function suitable for the P-channel transistor, N-rich TiN is formed as the first metal containing layer 25A. When the N-rich TiN is formed, a flow rate of nitrogen is selectively controlled to adjust the composition ratio of titanium to nitrogen. For example, the flow rate of nitrogen may be controlled to about 20 sccm to about 200 sccm. As such, the flow rate of nitrogen may be controlled to form N-rich TiN having a high work function of about 4.7 eV to about 5.1 eV. The N-rich TiN may be formed by ALD.

Figure 2C:
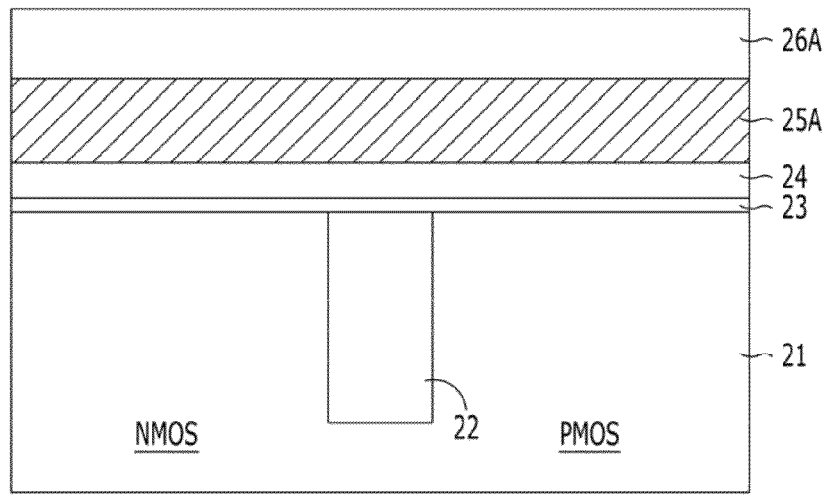

Referring to FIG. 2C, the anti-reaction layer 26A is formed over the first metal containing layer 25A. The anti-reaction layer 26A may serve as an anti-oxidation layer to block oxygen from being introduced into the first metal containing layer 25A during a subsequent process. Furthermore, the anti-reaction layer 26A may serve to prevent a reaction between the first metal containing layer 25A and a subsequent second metal containing layer. The anti-reaction layer 26A includes a silicon containing layer. The anti-reaction layer 26A may include polysilicon.

Figure 2D:
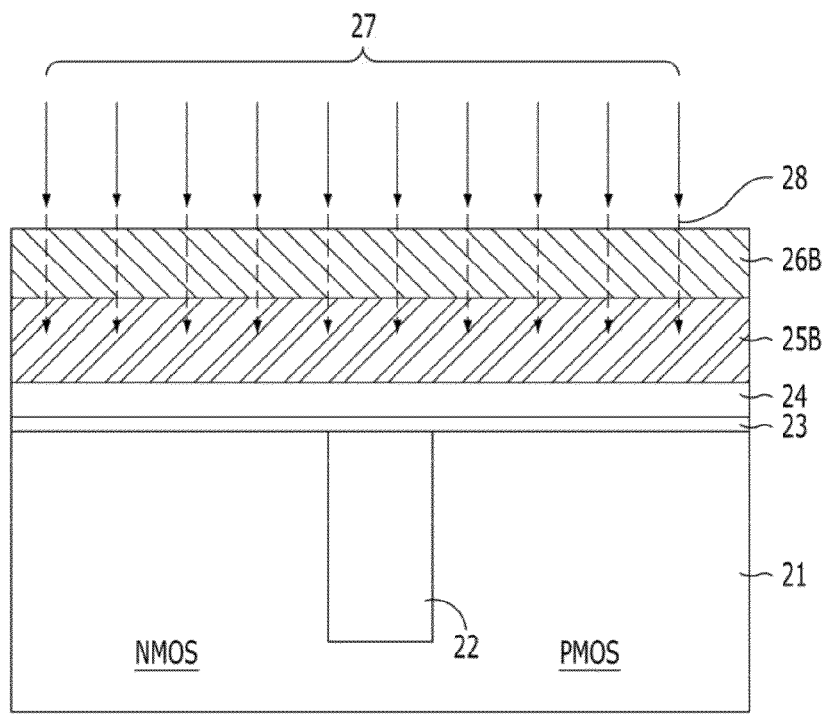

Referring to FIG. 2D, anneal 27 is performed. The anneal 27 may be performed in an atmosphere containing an effective work function adjust species. The anneal 27 may be performed under a nitrogen containing atmosphere. Nitrogen is an effective work function increase species. For example, the anneal 27 may be performed in an atmosphere of $NH_3$ at a temperature of about 700° C. for about one hour. As the anneal 27 is performed under the atmosphere containing the effective work function increase species, the effective work function increase species 28 may be injected into the first metal containing layer 25A. Accordingly, the content of the effective work function increase species contained in the first metal containing layer 25A may be further increased. As a result, the work function of the first metal containing layer 25A is further increased. Furthermore, the anti-reaction layer 26A is crystallized by the anneal 27. As the anti-reaction layer 26A is crystallized, the anti-reaction effect of the anti-reaction layer 26A is further improved.

As the anneal 27 is performed under the atmosphere containing the effective work function increase species, the first metal containing layer 25A is converted into a first metal containing layer 25B of which the content of the effective work function increase species is increased. Furthermore, the anti-reaction layer 26A is converted into a crystallized anti-reaction layer 26B.

Figure 2E:
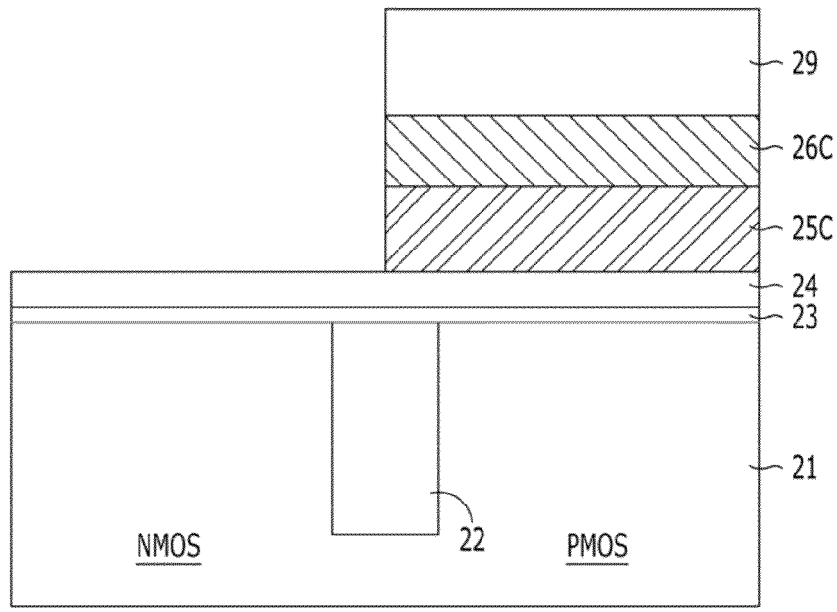

Referring to FIG. 2E, a mask pattern 29 is formed. The mask pattern 29 is used as an etch barrier to remove the anti-reaction layer 26B and the first metal containing layer 25B in the second region NMOS. Accordingly, the first metal containing layer is left in the first region PMOS, as indicated by reference numeral 25C. Furthermore, the anti-reaction layer is left in the first region PMOS, as indicated by reference numeral 26C. As both of the first metal containing layer and the anti-reaction layer are removed from the second region NMOS, the high-k material 24 is exposed.

Figure 2F:
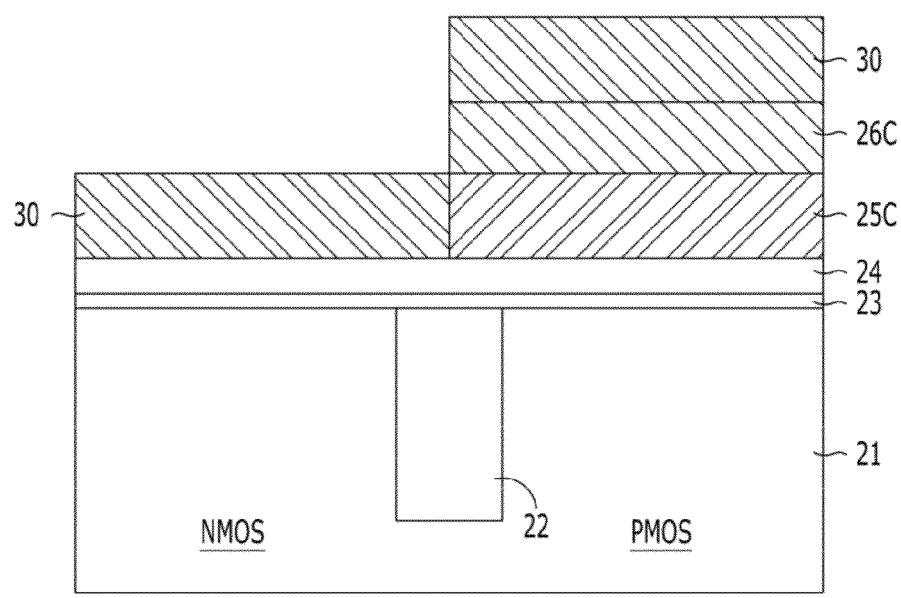

Referring to FIG. 2F, the mask pattern 29 is removed, and a second metal containing layer 30 is then formed on the entire surface of the substrate 21. The second metal containing layer 30 may contain a second effective work function adjust species. Due to the second effective work function adjust species, the second metal containing layer 30 has a work function suitable for the N-channel transistor. Therefore, the second metal containing layer 30 may become an N-type work function metal containing layer. The N-type work function metal containing layer may include materials having a work function of about 4.1 eV to about 4.5 eV. The second effective work function adjust species may include an effective work function decrease species to decrease the effective work function. The second metal containing layer 30 has a third work function. As the second metal containing layer 30 contains the effective work function decrease species, the third work function may be changed to a fourth work function smaller than the third work function. For example, the third work function may include a midgap work function. The fourth work function has a value of about 4.5 eV or less. Therefore, the second metal containing layer 30 becomes a low effective work function material. The second effective work function adjust species may include titanium.

The second metal containing layer 30 may include metal rich metal nitride. The metal nitride may include TiN. The second metal containing layer 30 may include TiN containing the second effective work function adjust species. The second metal containing layer 30 may include titanium as the second effective work function species. Therefore, the second metal containing layer 30 may include Ti-rich TiN. Ti-rich TiN refers to TiN containing titanium at a higher ratio than a chemical stoichiometric ratio of titanium to nitrogen. TiN has a different work function depending on the composition ratio of titanium to nitrogen. Ti-rich TiN may be formed by PVD. Accordingly, the composition ratio of titanium to nitrogen within TN may be easily adjusted. Since the second metal containing layer 30 has a low effective work function suitable for the N-channel transistor, Ti-rich TiN is formed as the second metal containing layer 30. When the Ti-rich TiN is formed, the flow rate of nitrogen is selectively controlled to adjust the composition ratio of nitrogen to titanium. As such, the flow rate of nitrogen may be controlled to form Ti-rich TiN having a work function of about 4.5 eV or less. The Ti-rich TiN may be formed by ALD.

When the second metal containing layer 30 is formed, a reaction between the first metal containing layer 25C and the second metal containing layer 30 is prevented by the anti-reaction layer 26C in the first region PMOS. That is, intermixing between the first metal containing layer 25C and the second metal containing layer 30 does not occur. Accordingly, since a process of removing the second metal containing layer 30 in the first region PMOS may be omitted, the fabrication process is simplified. Meanwhile, when the anti-reaction layer 26C is not provided, titanium is diffused from the second metal containing layer 30, thereby decreasing the work function of the first metal containing layer 25C. In an exemplary embodiment, as the anti-reaction layer 26C is formed over the first metal containing layer 25C, the work function of the first metal containing layer 25C may be prevented from being decreased by the second metal containing layer 30.

Although not illustrated, a low-resistance metal containing layer may be further formed on the entire surface of the resultant structure including the second metal containing layer 30. The low-resistance metal containing layer may include tungsten. The low-resistance metal containing layer serves to reduce resistance of the gate stack.

Figure 2G:
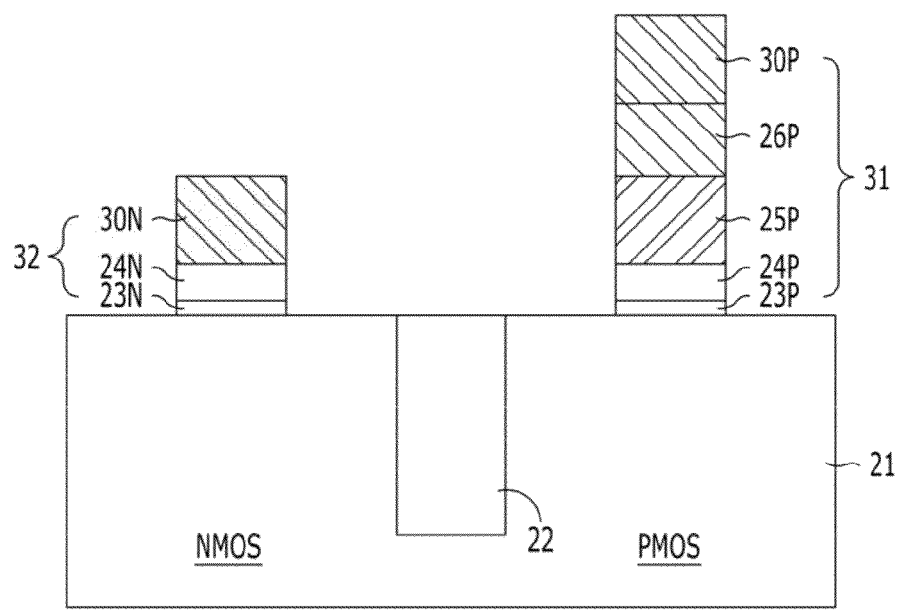

Referring to FIG. 2G, a gate mask (not illustrated) is used to perform a gate patterning process. For example, the second metal containing layer 30, the anti-reaction layer 26C, the first metal containing layer 25C, the high-k material 24, and the interface layer 23 are sequentially etched to form a first gate stack 31. Furthermore, the second metal containing layer 30, the high-k material 24, and the interface layer 23 are sequentially etched to form a second gate stack 32. The first and second gate stacks 31 and 32 may be patterned at the same time by one gate mask.

Accordingly, the first gate stack 31 is formed over the substrate 21 of the first region PMOS, and the second gate stack 32 is formed over the substrate 21 of the second region NMOS.

The first gate stack 31 may include a first interface layer 23P, a first high-k material 24P, a first metal containing gate electrode 25P, an anti-reaction layer pattern 26P, and a metal containing layer pattern 30P, which are sequentially stacked. The first metal containing gate electrode 25P is formed by etching the first metal containing layer 25C. The anti-reaction layer pattern 26P is formed by etching the anti-reaction layer 26C. The metal containing layer pattern 30P is formed by etching the second metal containing layer 30. The first metal containing gate electrode 25P contains the first effective work function adjust species. The first effective work function adjust species includes an effective work function increase species. The metal containing layer pattern 30P has no effect on the variation in effective work function of the first gate stack 31. That is, the effective work function of the first gate stack 31 is adjusted by the first metal containing gate electrode 25P.

The second gate stack 32 may include a second interface layer 23N, a second high-k material 24N, and a second metal containing gate electrode 30N, which are sequentially stacked. The second metal containing gate electrode 30N is formed by etching the second metal containing layer 30. The second metal containing gate electrode 30N contains the second effective work function adjust species. The second effective work function adjust species includes an effective work function decrease species. Therefore, the effective work function of the second gate stack 32 is adjusted by the second metal containing gate electrode 30N.

The first interface layer 23P and the second interface layer 23N are formed by etching the interface layer 23. The first high-k material 24P and the second high-k material 24N are formed by etching the high-k material 24.

As such, an exemplary semiconductor device has dual work function gate stacks including the first and second gate stacks 31 and 32 having different effective work functions.

Figure 2H:
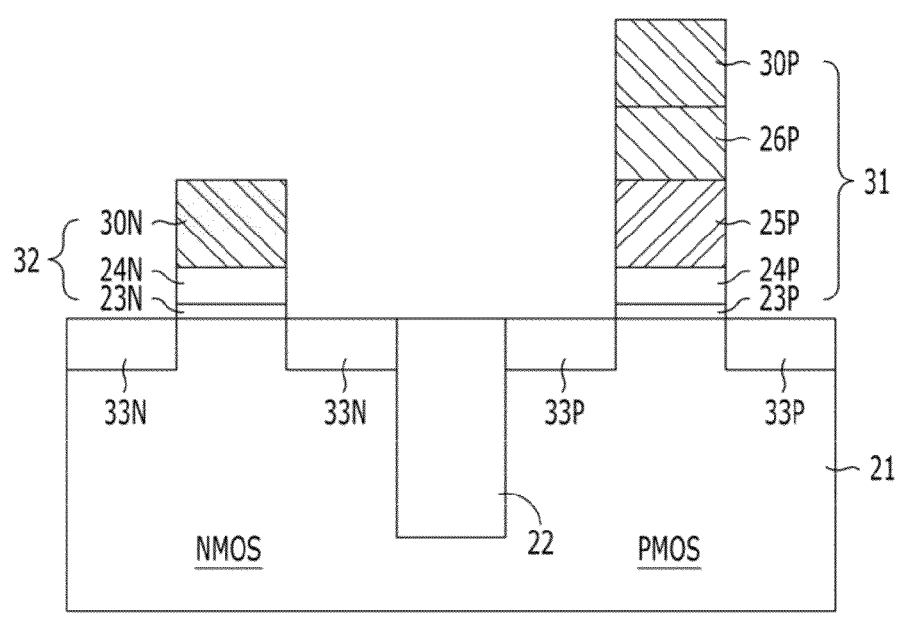

Referring to FIG. 2H, processes known in the art may be performed after the gate patterning process. For example, a source/drain formation process and the like may be performed. A source and drain may include a first source and drain 33P and a second source and drain 33N. The first source and drain 33P are formed in the first region PMOS. The second source and drain 33N are formed in the second region NMOS. The first source and drain 33P includes a P-type dopant, and the second source and drain 33N includes an N-type dopant.

As the first source and drain 33P and the second source and drain 33N are formed, a first transistor and a second transistor are formed. The first transistor includes the first gate stack 31 and the first source and drain 33P. The second transistor includes the second gate stack 32 and the second source and drain 33N. The first transistor may include a P-channel transistor. The second transistor may include a N-channel transistor. Therefore, a CMOS circuit including the N-channel transistor and the P-channel transistor is formed in the substrate 21. The CMOS circuit has dual work function gate stacks.

According to the above-described method, as the first gate stack 31 includes the first metal containing gate electrode 25P containing the effective work function increase species, the threshold voltage of the first transistor may be adjusted. For example, when the first transistor includes the P-channel transistor, the threshold voltage of the P-channel transistor may be reduced. Furthermore, the effective work function increase species of the first gate stack 32 is compensated for through the annealing performed under the atmosphere containing the effective work function increase species. Accordingly, the effective work function may be further increased to further reduce the threshold voltage.

As the second gate stack 32 includes the second metal containing gate electrode 30N containing the effective work function decrease species, the threshold voltage of the second transistor may be adjusted.

In accordance with an exemplary embodiment, the threshold voltages of the N-channel transistor and the P-channel transistor may be independently adjusted during an integration process of the CMOS circuit.

Figure 3:
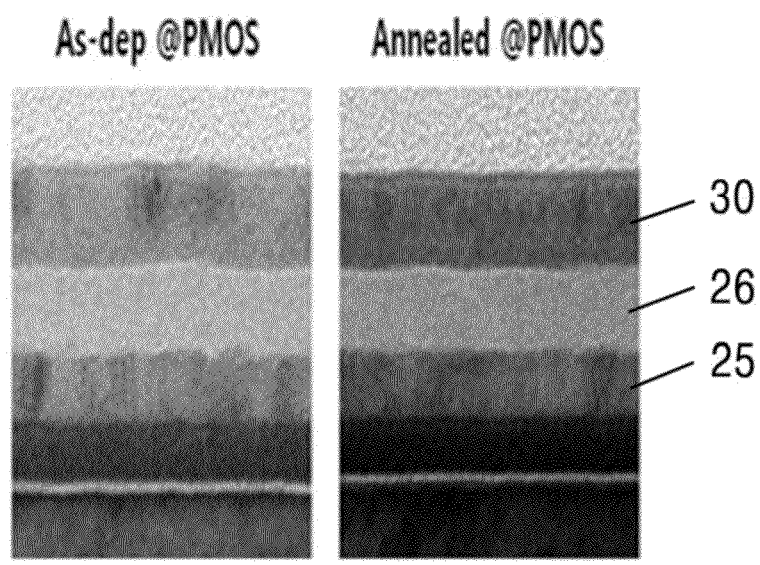
FIG. 3 is a diagram for explaining a state in which intermixing is prevented.

FIG. 3 is a diagram for explaining a state in which intermixing is prevented.

Referring to FIG. 3, it can be seen that intermixing between the first and second metal containing layers 25 and 30 is prevented by the anti-reaction layer 26 even after the anneal (Annealed @PMOS) as well as in the deposition state (As-dep @PMOS).

Figure 4A:
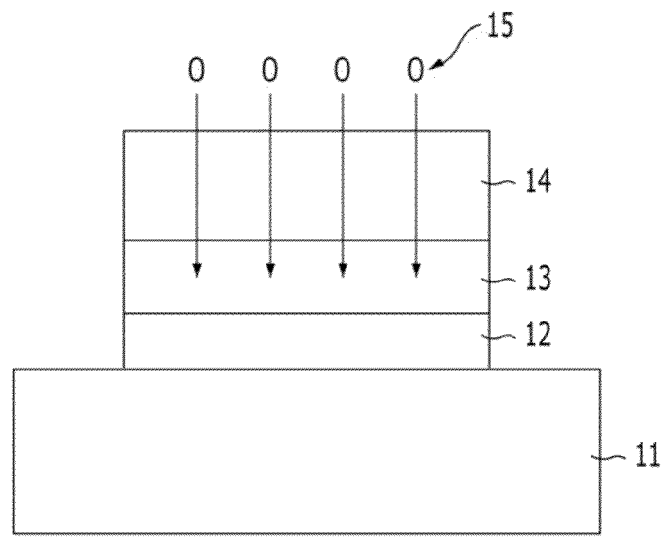
FIGS. 4A to 4C are diagrams illustrating a comparative example, in which no anti-reaction layer is provided over the first metal containing layer, compared with an exemplary embodiment.
Figure 4B:
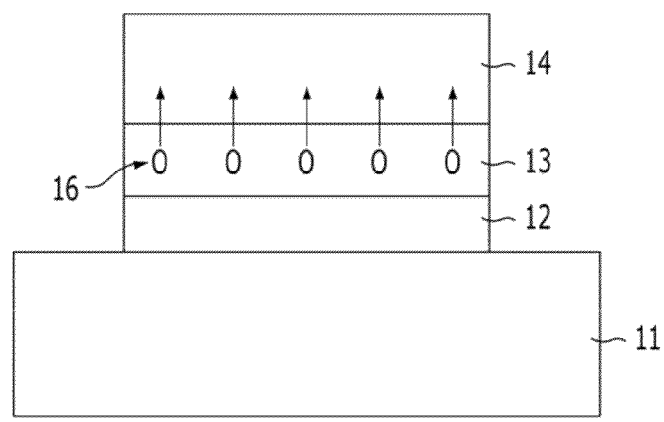
Figure 4C:
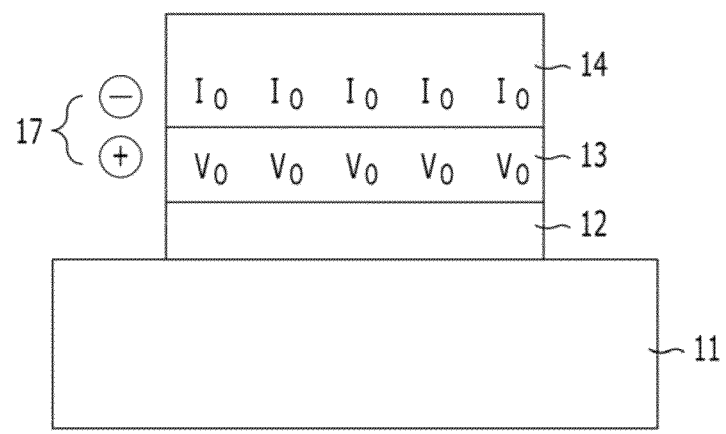

FIGS. 4A to 4C are diagrams illustrating a comparative example, in which no anti-reaction layer is provided over the first metal containing layer, compared with an exemplary embodiment.

Referring to FIG. 4A to 4C, an interface layer 12 is formed over a substrate 11, and a high-k material 13 is formed over the interface layer 12. A first metal containing layer 14 is formed over the high-k material 13. The first metal containing layer 14 may include N-rich TiN in the same manner as an above-described exemplary embodiment.

After the gate stack is formed, oxygen 15 may be introduced during a subsequent process. Since the oxygen 15 permeates the high-k material 13 through the first metal containing layer 14, oxygen 16 of the high-k material 13 is moved to the first metal containing layer 14. Accordingly, oxygen vacancies Vo are formed in the high-k material 13, and oxygen interstitials Io are formed in the first metal containing layer 14. When the oxygen vacancies Vo are formed, the high-k material 13 becomes electrically positive (+), and when the oxygen interstitials Io are formed, the first metal containing layer 14 becomes electrically negative (−). As such, dipoles 17 are formed between the two materials with electropositivity (+) and electronegativity (−). As the dipoles 17 are formed between the first metal containing layer 14 and the high-k material 13, the effective work function of the gate stack is decreased. When the effective work function is decreased, the threshold voltage of the transistor inevitably increases.

However, in an exemplary embodiment, the anti-reaction layer pattern 26P is formed over the first metal containing gate electrode 25P so as to prevent oxygen from being introduced into the first metal containing gate electrode 25P. Accordingly, a dipole may be suppressed from being formed between the first metal containing gate electrode 25P and the second high-k material 23P. As a result, the effective work function of the first gate stack 31 may be prevented from being decreased. Furthermore, when the first metal containing layer 25A is formed, the first metal containing layer 25A is controlled to contain the effective work function increase species, and the effective work function increase species is injected during the subsequent anneal 27. Accordingly, the effective work function of the first gate stack 31 may be further increased.

Figure 5:
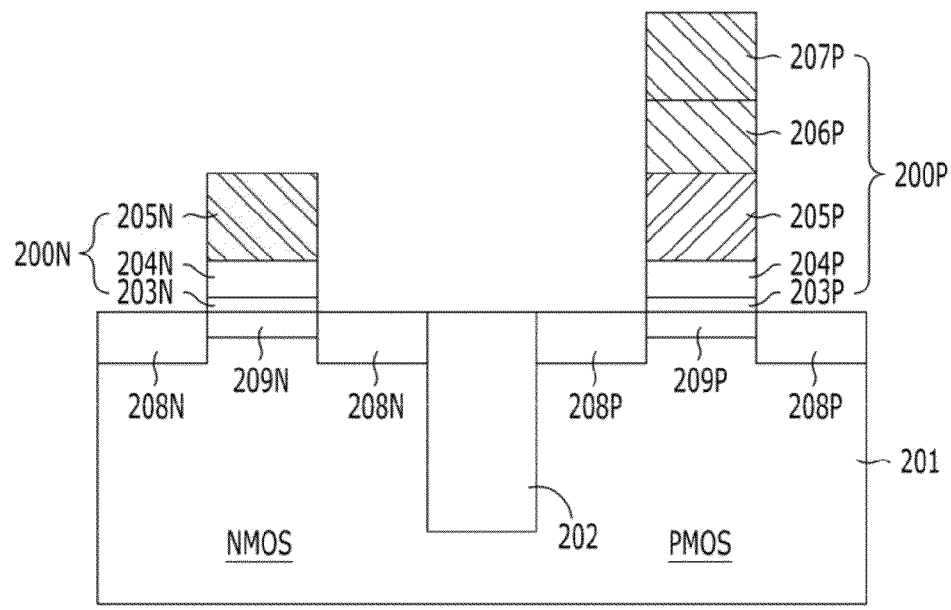
FIG. 5 is a diagram illustrating an exemplary semiconductor device.

FIG. 5 is a diagram illustrating an exemplary semiconductor device.

Referring to FIG. 5, a substrate 201 includes first and second regions. The substrate 201 may include a silicon substrate, a silicon germanium substrate, or a silicon-on-insulator (SOI) substrate. The first and second regions may be isolated by an isolation region 202. The first and second regions may include a transistor region. For example, the first region is where a P-channel transistor is formed (PMOS), and the second region is where an N-channel transistor is formed. A first gate stack 200P is formed over the substrate 201 of the first region PMOS, and a second gate stack 200N is formed over the substrate 201 of the second region NMOS. A first source 208P and a first drain 208P are formed in the substrate 201 at both sides of the first gate stack 200P. A second source 208N and a second drain 208N are formed in the substrate 201 at both sides of the second gate stack 200N. A first channel region 209P may be formed under the first gate stack 200P. A second channel region 209N may be formed under the second gate stack 200N. The first channel region 209P may contain germanium. The first channel region 209P may include a silicon-germanium channel region. The second channel region 209N may include a silicon channel region. Therefore, when the P-channel transistor includes the first gate stack 200P, the first channel region 209P becomes a P-channel region. When the N-channel transistor includes the second gate stack 200N, the second channel region 209N becomes an N-channel region.

The first gate stack 200P may include a first gate dielectric layer 204P, a first metal containing gate electrode 205P, an anti-reaction layer 206P, and a metal containing layer 207P, which are sequentially stacked. The first gate stack 200P may further include a first interface layer 203P formed between the first gate dielectric layer 204P and the substrate 201. The first gate stack 200P may include a first effective work function adjust species. The first effective work function adjust species may be contained in the first metal containing gate electrode 205P. Due to the first effective work function adjust species, the first gate stack 200P has an effective work function suitable for a P-channel transistor.

The second gate stack 200N may include a second gate dielectric layer 204N and a second metal containing gate electrode 205N that are sequentially stacked. The second gate stack 200N may further include a second interface layer 203N formed between the second gate dielectric layer 204N and the substrate 201. The second gate stack 200N may include a second effective work function adjust species. The second effective work function adjust species may be contained in the second metal containing gate electrode 205N. Due to the second effective work function adjust species, the second gate stack 200N has an effective work function suitable for an N-channel transistor.

As such, the first region PMOS and the second region NMOS include the first gate stacks 200P and the second gate stack 200N having different effective work functions.

An exemplary semiconductor device will be described in detail as follows.

First, the first interface layer 203P and the second interface layer 203N may be formed of the same material, and may have the same thickness. The first interface layer 203P or the second interface layer 203N may include silicon oxide or silicon nitride. For example, the first interface layer 203P or second interface layer 203N may include $SiO_2$ or SiON. The first interface layer 203P and second interface layer 203N serve to improve the interface characteristic between the substrate 201 and the first gate dielectric layer 204P and the second gate dielectric layer 204N, thereby enhancing an electron mobility characteristic.

The first gate dielectric layer 204P and the second gate dielectric layer 204N may be formed of the same material, and may have the same thickness. The first gate dielectric layer 204P and the second gate dielectric layers 204P may include a high-k material having a high dielectric constant. The high-k material has a larger dielectric constant than the dielectric constant (about 3.9) of $SiO_2$. Furthermore, the high-k material has a considerably larger physical thickness and a smaller EOT than $SiO_2$. The first gate dielectric layer 204P and the second gate dielectric layer 204N may have a larger dielectric constant than the first interface layer 203P and the second interface layer 203N. The first gate dielectric layer 204P or the second gate dielectric layer 204N may include, for example a metal oxide, a metal silicate, or a metal silicate. The metal oxide may include, for example, hafnium (Hf), aluminum (Al), lanthanum (La), or zirconium (Zr). The metal oxide may include, for example, hafnium oxide, aluminum oxide, lanthanum oxide, zirconium oxide, or a combination thereof. For example, the metal oxide may include $HfO_2$, $Al_2O_3$, $La_2O_3$, $ZrO_2$, or a combination thereof. The metal silicate may include, for example, Hf or Zr. For example, the metal silicate may include hafnium silicate (HfSiO), zirconium silicate (ZrSiO), or a combination thereof. The metal silicate nitride may include hafnium silicate nitride (HfSiON), zirconium silicate nitride (ZrSiON), or a combination thereof.

The first metal containing gate electrode 205P may contain the first effective work function adjust species. Due to the first effective work function adjust species, the first gate stack 200P has an effective work function suitable for a P-channel transistor. The first metal containing gate electrode 205P may include a P-type work function metal containing layer. Therefore, the first metal containing gate electrode 205P may become a P-type work function metal containing gate electrode. The P-type work function metal containing gate electrode may include a material having a work function of about 4.7 eV or more (e.g., about 4.7 eV to about 5.1 eV). The P-type work function has a similar value to the work function of P-type polysilicon. The P-type work function metal containing gate electrode has a larger work function than a mid-gap work function of silicon. The first effective work function adjust species may include an effective work function increase species to increase the effective work function. As the effective work function increase species is contained, the effective work function of the first gate stack 200P is increased. As such, the first metal containing gate electrode 205P containing the effective work function increase species may be referred to as a high effective work function material.

The effective work function increase species may include nitrogen. The first metal containing gate electrode 205P may include nitrogen as the first effective work function adjust species. The first metal containing gate electrode 205P may include metal nitride containing the first effective work function adjust species. The first metal containing gate electrode 205P may include nitrogen rich metal nitride. Here, the rich nitrogen becomes the first effective work function adjust species. The metal nitride may include titanium nitride. When the first effective work function adjust species includes nitrogen, the first metal containing gate electrode 205P may include nitrogen rich titanium nitride. The nitrogen rich titanium nitride refers to titanium nitride containing nitrogen at a higher ratio than a chemical stoichiometric ratio of titanium to nitrogen. Hereafter, the nitrogen rich titanium nitride is referred to as nitrogen rich TiN (N-rich TiN). TiN has a different effective work function depending on a composition ratio of titanium to nitrogen. For example, N-rich TiN may have a P-type effective work function suitable for the P-channel transistor. The N-rich TiN may be formed by PVD. Accordingly, the composition ratio of titanium to nitrogen within TiN may be easily adjusted. N-rich TiN is formed as the first metal containing gate electrode 205P. When the N-rich TiN is formed, the flow rate of nitrogen may be selectively controlled to adjust the composition ratio of nitrogen to titanium. As such, the flow rate of nitrogen may be controlled to form N-rich TiN having a P-type work function. The N-rich TiN may be formed by ALD.

The second metal containing gate electrode 205N may contain a second effective work function adjust species. Due to the second effective work function adjust species, the second gate stack 200N has an effective work function suitable for the N-channel transistor. The second metal containing gate electrode 205N may include an N-type work function metal containing layer. Therefore, the second metal containing gate electrode 205N may become an N-type work function metal containing gate electrode. The N-type work function metal containing gate electrode may include a material having a work function of about 4.3 eV or less. The N-type work function has a similar value to the work function of N-type polysilicon. The N-type work function metal containing gate electrode has a smaller work function than the midgap work function of silicon. The second work function adjust species may include an effective work function decrease species to decrease the effective work function. As the effective work function decrease species is contained, the effective work function of the second gate stack 200N decreases. As such, the second metal containing gate electrode 205N containing the effective work function decrease species may be referred to as a low effective work function material. The effective work function decrease species may include a metal. The second metal containing gate electrode 205N may include a metal as the second effective work function adjust species. The second metal containing gate electrode 205N may include a metal nitride containing the second effective work function adjust species. The second metal containing gate electrode 205N may include metal rich metal nitride. Here, the rich metal becomes the second effective work function adjust species.

The metal nitride as the second metal containing gate electrode 205N may include titanium nitride. When the second effective work function adjust species includes titanium, the second metal containing gate electrode 205N may include Ti rich TiN. The Ti-rich TiN refers to TiN containing titanium at a higher ratio than a chemical stoichiometric ratio of titanium to nitrogen. TiN has a different work function depending on the comparison ratio of titanium to nitrogen. For example, Ti-rich TiN may have an N-type effective work function suitable for the N-channel transistor. The Ti-rich TiN may be formed by PVD. Accordingly, the composition ratio of titanium to nitrogen within TiN may be easily adjusted. Ti-rich TiN is formed as the second metal containing gate electrode 205N. When the Ti-rich TiN is formed, the flow rate of nitrogen may be selectively controlled to adjust the composition ratio of titanium to nitrogen. As such, the flow rate of nitrogen may be controlled to form Ti-rich TiN having an N-type effective work function. The Ti-rich TiN may be formed by ALD.

The anti-reaction layer 206P and the metal containing layer 207P formed over the first metal containing gate electrode 205P may serve as an anti-oxidation layer to block oxygen from being introduced into the first metal containing gate electrode 205P and the first gate dielectric layer 204P during a subsequent process. The anti-reaction layer 206P may serve to prevent inter-mixing between the first metal containing gate electrode 205P and the metal containing layer 207P. The anti-reaction layer 206P contains a silicon containing layer. The anti-reaction layer 206P may include polysilicon.

The metal containing layer 207P may be formed of the same material as the second metal containing gate electrode 205N. Therefore, the metal containing layer 207P may include a metal rich metal nitride corresponding to a high effective work function material. That is, the metal containing layer 207P may include Ti-rich TiN. Although the metal containing layer 207P includes a high effective work function material, the work function of the first metal containing gate electrode 205P is not decreased because of the anti-reaction layer 206P. The effective work function of the first gate stack 200P is dominantly adjusted by the first metal containing gate electrode 205P. Although described below, the metal containing layer 207P may be formed at the same time when the second metal containing gate electrode 205N is formed, and is not removed during a subsequent process.

The first metal containing gate electrode 205P and the anti-reaction layer 206P may be annealed. The annealing may be performed at an atmosphere containing the first effective work function adjust species. The annealing may be performed in a nitrogen containing atmosphere. Nitrogen is an effective work function increase species. For example, the annealing may be performed in an atmosphere of $NH_3$ at a temperature of about 700° C. for about one hour. As the annealing is performed in an atmosphere containing the effective work function increase species, the effective work function increase species may be injected into the first metal containing gate electrode 205P. Accordingly, the content of the effective work function increase species contained in the first metal containing gate electrode 205P may be further increased. As a result, the effective work function of the first gate stack 200P is further increased. Furthermore, the anti-reaction layer 206P is crystallized by the annealing. As the crystallized anti-reaction layer 206P is formed, an oxygen introduction prevention effect and a reaction prevention effect are further improved.

The first source and drain 208P may include a P-type source and drain, and the second source and drain 208N may include an N-type source and drain.

In FIG. 5, since the first gate stack 200P includes the first metal containing gate electrode 205P containing the first effective work function adjust species to increase the effective work function, the first gate stack 200p may secure a high effective work function suitable for the P-channel transistor. Furthermore, the effective work function adjust species is injected into the first metal containing gate electrode 205P through the annealing, thereby further increasing the effective work function. Furthermore, the anti-reaction layer 206P is formed over the first metal containing gate electrode 205P, thereby preventing the effective work function of the first metal containing gate electrode 205P from being decreased during a subsequent process. As the first channel region 209P containing germanium is formed under the first gate stack 200P, the energy band gap reduction occurs. Accordingly, the threshold voltage may be adjusted.

As the first gate stack 200P including the anti-reaction layer 206P and the annealed first metal containing gate electrode 205P containing the first effective work function adjust species is formed and the first channel region 209P containing germanium is formed under the first gate stack 200P, the threshold voltage of the transistor including the first gate stack 200P may be easily adjusted.

Furthermore, as the second gate stack 200N includes the second metal containing gate electrode 205N containing the second effective work function adjust species to decrease the effective work function, the second gate stack 200N may secure a low effective work function suitable for the N-channel transistor.

In accordance an exemplary embodiment, the threshold voltages of the N-channel transistor and the P-channel transistor may be independently adjusted during an integration process of a CMOS device.

The exemplary semiconductor device a CMOS device. However, the exemplary semiconductor device is not limited to the CMOS device, but may be applied to any semiconductor device in which an N-channel transistor and a P-channel transistor are formed. The P-channel transistor may include, for example, a PMOSFET or a PMISFET. The N-channel transistor may include, for example, a NMOSFET or a NMISFET.

Figure 6:
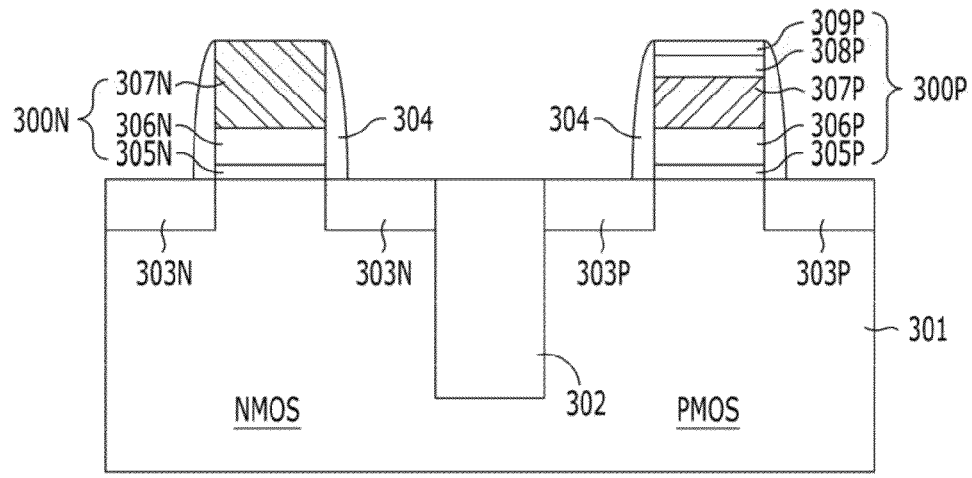
FIG. 6 is a diagram illustrating an exemplary semiconductor device.

FIG. 6 is a diagram illustrating an exemplary semiconductor device. FIG. 6 illustrates a CMOS device formed by a gate-last process, which refers to a process of forming a source and drain and then forming a gate stack.

Referring to FIG. 6, an isolation region 302 is formed in a substrate 301. A dummy gate stack (not illustrated) and a spacer 304 are formed over the substrate 301. A first source 303P and a first drain 303P and a second source 303N and a second drain 303N are formed in the substrate 301. Then, an annealing for activation may be performed.

The dummy gate stack is removed, and a first gate stack 300p and a second gate stack 300N are then formed. The method for forming the first and second gate stacks 300P and 300N may be performed as described above with respect to FIGS. 1, 2A-2H and FIG. 5.

The first gate stack 300P may include a first gate dielectric layer 306P, a first metal containing gate electrode 307P, an anti-reaction layer 308P, and a metal containing layer 309P, which are sequentially stacked. The first gate stack 300P may further include a first interface layer 304P formed between the first gate dielectric layer 306P and the substrate 301. The first gate stack 300P may include a first effective work function adjust species. The first effective work function adjust species may be contained in the first metal containing gate electrode 307P. Due the first effective work function adjust species, the first gate stack 300P has an effective work function suitable for a P-channel transistor.

The second gate stack 300N may include a second gate dielectric layer 306N and a second metal containing gate electrode 307N which are sequentially stacked. The second gate stack 300N may further include a second interface layer 304N formed between the second gate dielectric layer 306N and the substrate 301. The second gate stack 300N may include a second effective work function adjust species. The second effective work function adjust species may be contained in the second metal containing gate electrode 307N. Due the second effective work function adjust species, the second gate stack 300N has an effective work function suitable for an N-channel transistor.

The first region PMOS and the second region NMOS include the first gate stack 300P and the second gate stack 300N, respectively, which have different effective work functions. The detailed descriptions of the first gate stack 300P and the second gate stack 300N may be based on the above-description with respect to FIGS. FIGS. 1, 2A-2H and FIG. 5.

In an exemplary embodiment, a channel region containing germanium may be formed under the first gate stack 300P. Furthermore, a silicon channel region may be formed under the second gate stack 300N.

An exemplary CMOS device may be applied to a DRAM (Dynamic Random Access Memory). Without being limited thereto, however, the CMOS device may be applied to, for example, a SRAM (Static Random Access Memory), a flash memory, a FeRAM (Ferroelectric Random Access Memory), a MRAM (Magnetic Random Access Memory), or a PRAM (Phase Change Random Access Memory).

Figure 7:
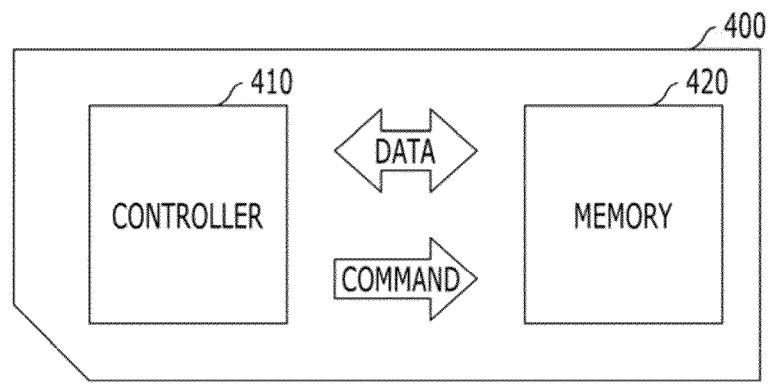
FIG. 7 is a schematic view of a memory card.

FIG. 7 is a schematic view of a memory card. Referring to FIG. 7, the memory card 400 may include a controller 410 and a memory 420. The controller 410 and the memory 420 may exchange electrical signals. For example, the memory 420 and the controller 410 may exchange data according to a command of the controller 410. Accordingly, the memory card 400 may store data in the memory 420, or output data from the memory 420 to the outside. The memory 420 may include the above-described CMOS device in a specific part thereof, for example, a peripheral circuit unit. The memory card 400 may be used as data storage media of various portable devices. For example, the memory card 400 may include a memory stick card, a smart media card (SM), a secure digital card (SD), a mini secure digital card (mini SD), or a multi-media card (MMC).

Figure 8:
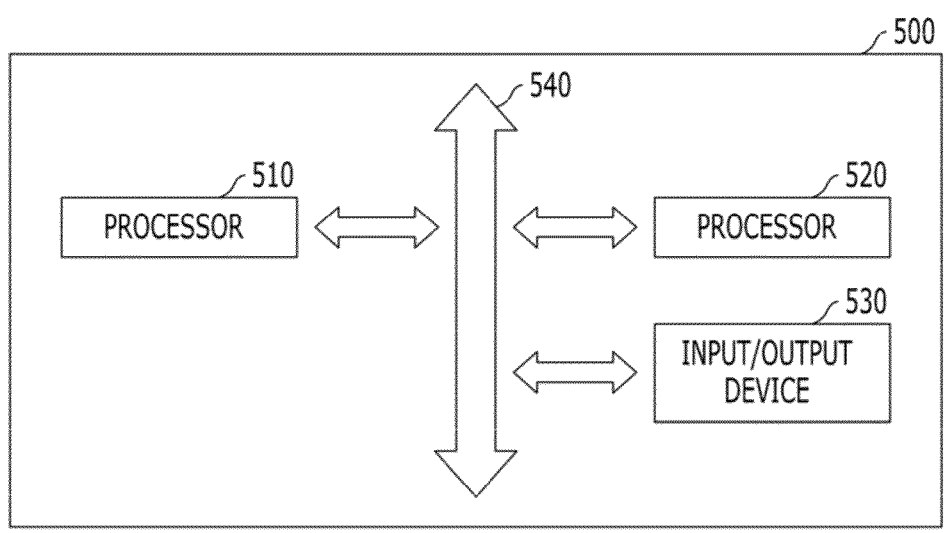
FIG. 8 is a block diagram illustrating an electronic system.

FIG. 8 is a block diagram illustrating an electronic system. Referring to FIG. 8, the electronic system 500 may include a processor 510, an input/output device 530, and a chip 520, which perform data communication through a bus 540. The processor 510 serves to perform a program operation and control the electronic system 500. The input/output device 530 may be used to input or output data of the electronic system 500. The electronic system 500 may be connected to an external device, for example, a personal computer or network, and exchange data with the external device through the input/output device 530. The chip 520 may store codes and data for the operation of the processor 510, and may process a part of operations assigned by the processor 510. For example, the chip 520 may include the above-described CMOS device. The electronic system 500 may form various electronic control devices requiring the chip 520. For example, the electronic system 500 may be applied to a mobile phone, an MP3 player, a navigation system, a solid state disk (SSD), or household appliances.

In accordance with an exemplary embodiment, the metal containing gate electrode containing an effective work function adjust species at a higher ratio may be formed to increase the effective work function of the gate stack. Furthermore, through the subsequent anneal process, the content of the effective work function adjust species contained in the metal containing gate electrode may be further increased. As a result, the effective work function of the gate stack may be increased to further reduce the threshold voltage of the transistor.

Although exemplary embodiments have been described for illustrative purposes, it will be apparent to those skilled in the art that various changes and modifications may be made without departing from the spirit and scope of the invention as defined in the following claims.

What is claimed is:

1. A semiconductor device comprising:
   a substrate comprising a first region and a second region;
   a first gate stack formed over the first region, the first gate stack comprising:
      a first metal containing gate electrode containing a first effective work function adjust species;
      an anti-reaction layer formed over the first metal containing gate electrode; and
      a metal containing layer formed over the anti-reaction layer; and a second gate stack formed over the second region, the
second gate stack comprising:
a second metal containing gate electrode containing a second effective work function adjust species
wherein the anti-reaction layer is formed between the first metal containing gate electrode and the metal containing layer,
wherein the anti-reaction layer comprises polysilicon.

2. The semiconductor device of claim 1, wherein the metal containing layer comprising a same material as a material of the second metal containing gate electrode.

3. The semiconductor device of claim 1, wherein the first effective work function adjust species comprises nitrogen.

4. The semiconductor device of claim 1, wherein the second effective work function adjust species comprises titanium.

5. The semiconductor device of claim 1, wherein the first metal containing gate electrode comprises titanium nitride (TiN) including nitrogen at a higher ratio than a chemical stoichiometric ratio of titanium to nitrogen.

6. The semiconductor device of claim 1, wherein the second metal containing gate electrode comprises titanium nitride (TiN) including titanium at a higher ratio than a chemical stoichiometric ratio of titanium to nitrogen.

7. The semiconductor device of claim 1, wherein the first gate stack comprises a gate stack of a P-channel transistor.

8. The semiconductor device of claim 1, wherein the second gate stack comprises a gate stack of an N-channel transistor.

9. The semiconductor device of claim 1, wherein the first gate stack further comprises a first interface layer and a first high-k material formed under the first metal containing gate electrode, and
the second gate stack further comprises a second interface layer and a second high-k material formed under the second metal containing gate electrode.

* * * * *